United States Patent
Choi et al.

(10) Patent No.: US 12,429,919 B2
(45) Date of Patent: *Sep. 30, 2025

(54) SLIDING DISPLAY APPARATUS

(71) Applicant: LG DISPLAY CO., LTD., Seoul (KR)

(72) Inventors: YeongRak Choi, Paju-si (KR); SeokHyo Cho, Paju-si (KR)

(73) Assignee: LG Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/770,178

(22) Filed: Jul. 11, 2024

(65) Prior Publication Data

US 2024/0373569 A1 Nov. 7, 2024

Related U.S. Application Data

(63) Continuation of application No. 18/229,321, filed on Aug. 2, 2023, now Pat. No. 12,069,823, which is a continuation of application No. 17/399,621, filed on Aug. 11, 2021, now Pat. No. 11,805,606.

(30) Foreign Application Priority Data

Dec. 31, 2020 (KR) ......................... 10-2020-0189806

(51) Int. Cl.
*G06F 1/16* (2006.01)
*H05K 5/02* (2006.01)

(52) U.S. Cl.
CPC ......... *G06F 1/1652* (2013.01); *H05K 5/0217* (2013.01)

(58) Field of Classification Search
CPC ............................ H05K 5/0217; G06F 1/1652
See application file for complete search history.

(56) References Cited

U.S. PATENT DOCUMENTS

| | | | |
|---|---|---|---|
| 8,711,566 B2 | 4/2014 | O'Brien | |
| 10,938,970 B1* | 3/2021 | Lee | H04M 1/0268 |
| 11,194,363 B2 | 12/2021 | Kim et al. | |
| 11,914,423 B2 | 2/2024 | Shin | |
| 2010/0302772 A1 | 12/2010 | Lin | |
| 2013/0058063 A1* | 3/2013 | O'Brien | G06F 1/1624 361/807 |
| 2015/0116921 A1 | 4/2015 | Hsu | |

(Continued)

FOREIGN PATENT DOCUMENTS

| | | |
|---|---|---|
| CN | 102902308 A | 1/2013 |
| CN | 106257569 A | 12/2016 |

(Continued)

OTHER PUBLICATIONS

Chinese Office Action dated Dec. 1, 2023 issued in Patent Application No. 202110938229.X w/English Translation (7 pages).

*Primary Examiner* — Sagar Shrestha
(74) *Attorney, Agent, or Firm* — Fish & Richardson P.C.

(57) ABSTRACT

A sliding display apparatus comprises a display panel including first to fourth side surfaces, a case configured to accommodate the display panel, a cover configured to cover an opened upper surface of the case and including a hole provided at one side thereof, a wire driving part connected to at least one wire connected to a lower surface of the display panel, and a sliding controlling part configured to control the wire driving part, and an upper portion of the display panel is exposed through the hole provided at the cover.

19 Claims, 6 Drawing Sheets

(56) References Cited

U.S. PATENT DOCUMENTS

| | | |
|---|---|---|
| 2016/0037657 A1 | 2/2016 | Yoshizumi |
| 2017/0013726 A1 | 1/2017 | Han et al. |
| 2018/0188778 A1 | 7/2018 | Shin |
| 2019/0138058 A1 | 5/2019 | Kwon et al. |
| 2020/0221585 A1 | 7/2020 | Cho |
| 2020/0363841 A1 | 11/2020 | Kim et al. |
| 2021/0044683 A1* | 2/2021 | He ........................ G06F 1/1652 |
| 2021/0223820 A1 | 7/2021 | Yoo |
| 2022/0232716 A1* | 7/2022 | Lim ....................... H10K 77/00 |
| 2023/0095528 A1 | 3/2023 | Park et al. |

FOREIGN PATENT DOCUMENTS

| | | |
|---|---|---|
| CN | 110599912 A | 12/2019 |
| JP | 2005-349977 A | 12/2005 |
| WO | WO 2018/186631 A1 | 10/2018 |

\* cited by examiner

SLIDING DISPLAY APPARATUS

CROSS-REFERENCE TO RELATED APPLICATIONS

This application is a continuation of U.S. patent application Ser. No. 18/229,321, filed on Aug. 2, 2023, which is a continuation of U.S. patent application Ser. No. 17/399,621, filed on Aug. 11, 2021, now U.S. Pat. No. 11,805,606, issued on Oct. 31, 2023, which claims the priority of the Korean Patent Application No. 10-2020-0189806, filed on Dec. 31, 2020, which are hereby incorporated by reference in their entirety.

BACKGROUND

Field of the Disclosure

The present disclosure relates to a sliding display apparatus.

Description of the Background

Recently, rollable display apparatuses are being released by using a characteristic where a light emitting display panel is rolled. However, in rollable display apparatuses, because a light emitting display panel should be rolled, a space for enabling the light emitting display panel to be rolled is needed, and due to this, a height of a display apparatus should increase.

When a height of a display apparatus increases, it is difficult to mount a display apparatus on things such as desks.

SUMMARY

Accordingly, the present disclosure is directed to providing a sliding display apparatus that substantially obviates one or more problems due to limitations and disadvantages of the related art.

More specifically, the present disclosure is directed to providing a sliding display apparatus in which a display panel unfolded in a case may be exposed in a direction toward an upper end of the case.

To achieve these and other advantages of the inventive concepts, as embodied and broadly described herein, a sliding display apparatus comprises a display panel including first to fourth side surfaces, a case configured to accommodate the display panel, a cover configured to cover an opened upper surface of the case and including a hole provided at one side thereof, a wire driving part connected to at least one wire connected to a lower surface of the display panel, and a sliding controlling part configured to control the wire driving part, and an upper portion of the display panel is exposed through the hole provided at the cover.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description of the present disclosure are exemplary and explanatory and are intended to provide further explanation of the inventive concept as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain principles of the disclosure.

In the drawings.

Figure 1:
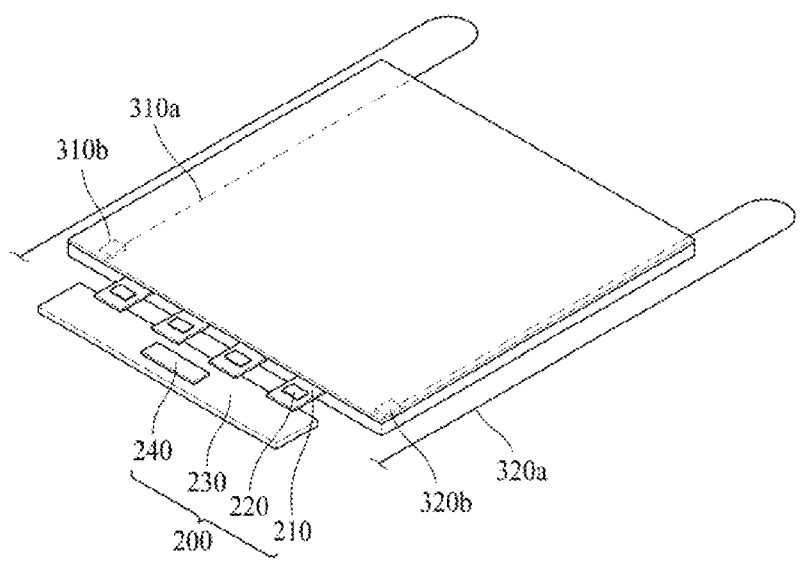
FIG. 1 is a perspective view of a display panel applied to a sliding display apparatus according to an aspect of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element or layer is "connected," "coupled," or "adhered" to another element or layer means that the element or layer may not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

In the description of aspects, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and aspects of the present disclosure are not limited thereto, unless otherwise specified.

Features of various aspects of the present disclosure may be partially or overall coupled to or combined with each other, and may be variously inter-operated with each other and driven technically as those skilled in the art may sufficiently understand. The aspects of the present disclosure may be carried out independently from each other, or may be carried out together in co-dependent relationship.

Hereinafter, aspects of the present disclosure will be described in detail with reference to the accompanying drawings.

Figure 2:
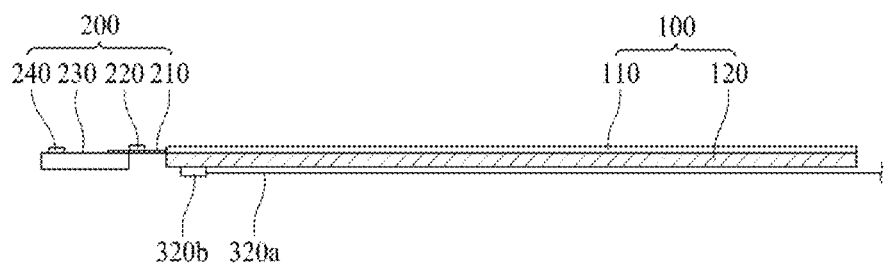
FIG. 2 illustrates a side surface of a display panel applied to a sliding display apparatus according to an aspect of the present disclosure.

FIG. 1 is a perspective view of a display panel applied to a sliding display apparatus according to an aspect of the present disclosure, and FIG. 2 illustrates a side surface of a display panel applied to the sliding display apparatus according to an aspect of the present disclosure.

With reference to FIGS. 1 and 2, the sliding display apparatus according to an aspect of the present disclosure may include a display panel 100 which displays an image and a panel driving part 200 which drives the display panel 100.

The display panel 100 may include a panel 110 which displays an image and a back plate 120 attached on a lower surface of the panel 110. The panel 110 may include a plurality of gate lines, a plurality of data lines, and a plurality of pixels.

The panel 110 may be a light emitting display panel. In this case, each of a plurality of pixels of the light emitting display panel may include a light emitting device, a transistor, and a capacitor. The light emitting device may include one of an organic light emitting layer, an inorganic light emitting layer, and a quantum dot light emitting layer. The light emitting device may include a stack or combination structure of an organic light emitting layer (or an inorganic light emitting layer) and a quantum dot light emitting layer.

The panel 110 may be a liquid crystal display panel. In this case, each of a plurality of pixels of the liquid crystal display panel may include a liquid crystal, a transistor, and a capacitor. A backlight part for irradiating light may be attached on the panel 110. The backlight part may include a plurality of light emitting diodes which emit light.

In addition to the light emitting display panel and the liquid crystal display panel, the panel 110 may be one of various kinds of panels which are bendable at a certain angle.

The back plate 120 may be implemented in a thin plate form to be bent at a certain angle along with the panel 110. For example, the back plate 120 may include various kinds of metals such as aluminum.

One or more wires (for example, first and second wires) 310a and 320a may be disposed on a lower surface of the back plate 120. In FIG. 1, the display panel 100 where the first wire 310a and the second wire 320a are disposed is illustrated for an aspect of the present disclosure.

A first fixing part 310b connected to the first wire 310a may be provided at one side of the lower surface of the back plate 120. For example, the first fixing part 310b connected to the first wire 310a may be provided at an end of the one side or the one side of the lower surface of the back plate 120. A second fixing part 320b connected to the second wire 320a may be provided at the other side of the lower surface of the back plate 120. For example, the second fixing part 320b connected to the second wire 320a may be provided at an end of the other side or the other side of the lower surface of the back plate 120.

For example, in FIGS. 1 and 2, a portion, connected to the panel driving part 200, of the display panel 100 may be a lower portion or a first portion of the display panel 100, and a portion, facing the lower portion, of the display panel 100 may be an upper portion or a second portion of the display panel 100. In the following description, therefore, the upper portion or the first portion may be an upper portion or a first portion of the panel 110 and the back plate 120, and the lower portion or the second portion may be a lower portion or a second portion of the panel 110 and the back plate 120.

Moreover, the display panel 100 may include a first side surface, a second side surface, a third side surface, and a fourth side surface. In the following description, the upper portion or the second portion of the display panel 100 may be a portion including the first side surface of the display panel 100.

In this case, the first fixing part 310b connected to the first wire 310a may be provided at a left portion of the lower portion or the first portion of the back plate 120. For example, the first fixing part 310b connected to the first wire 310a may be provided at the left portion or a left end of the lower portion or the first portion of the back plate 120. The second fixing part 320b connected to the second wire 320a may be provided at a right portion of the lower portion or the first portion of the back plate 120. For example, the second fixing part 320b connected to the second wire 320a may be provided at the right portion or a right end of the lower portion or the first portion of the back plate 120.

The first fixing part 310b and the second fixing part 320b may be fixed to the back plate 120. For example, the first fixing part 310b and the second fixing part 320b may be fixed to the back plate 120 through soldering, but aspects of the present disclosure are not limited thereto.

One side of the first wire 310a may be fixed to the first fixing part 310b through soldering. For example, one end of the first wire 310a may be fixed to the first fixing part 310b through soldering. One side of the second wire 320a may be fixed to the second fixing part 320b through soldering. For example, one end of the second wire 320a may be fixed to the second fixing part 320b through soldering.

The panel driving part 200 may include a gate driver, a data driver 220, and a panel controlling part 240. The gate driver may supply gate pulses to the gate lines included in the panel 110. For example, the gate driver may be configured with an integrated circuit (IC) and may be disposed at a non-display area of the panel 110, or may be configured with an IC and may be disposed at a flexible film 210. Alternatively, the gate driver may be directly embedded into the non-display area by using a gate-in panel (GIP) type.

The data driver 220 may supply data voltages to the data lines included in the panel 110. For example, the data driver 220 may be configured with an IC and may be disposed at the non-display area of the panel 110, or may be configured with an IC and may be disposed at the flexible film 210. Alternatively, the data driver 220 may be directly embedded into the non-display area.

The gate driver and the data driver 220 may be disposed at different flexible films, or may be disposed at one flexible film 210. For example, in FIGS. 1 and 2, the driver 200 where only the panel driving part 220 is disposed at the flexible film 210 is illustrated, but aspects of the present disclosure are not limited thereto. For example, the gate driver and the data driver 220 may all be disposed at one flexible film 210.

The flexible film 210, on which at least one of the gate driver and the data driver 220 is disposed, may be attached on a printed circuit board (PCB) 230 and may be electrically connected to the panel controlling part 240 disposed at the PCB 230.

The panel controlling part 240 may control the gate driver and the data driver 220. The panel driving part 240 may be connected to an external system which controls the sliding display apparatus according to an aspect of the present disclosure.

For example, the panel controlling part 240 may realign pieces of input video data transferred from an external system based on a timing synchronization signal transferred from the external system. The panel controlling part 240 may include a data align part, a control signal generating part, an input part, and an output part. The data align part may supply pieces of realigned image data to the data driver 220. The control signal generating part may generate a gate control signal and a data control signal based on the timing synchronization signal. The input part may receive the timing synchronization signal and the pieces of input video data transferred from the external system. The output part may output the pieces of image data generated by the data align part and control signals, generated by the control signal generating part, to the data driver 220 or the gate driver. The gate control signal may be a signal which controls the gate driver, and the data control signal may be a signal which controls the data driver 220.

Figure 3:
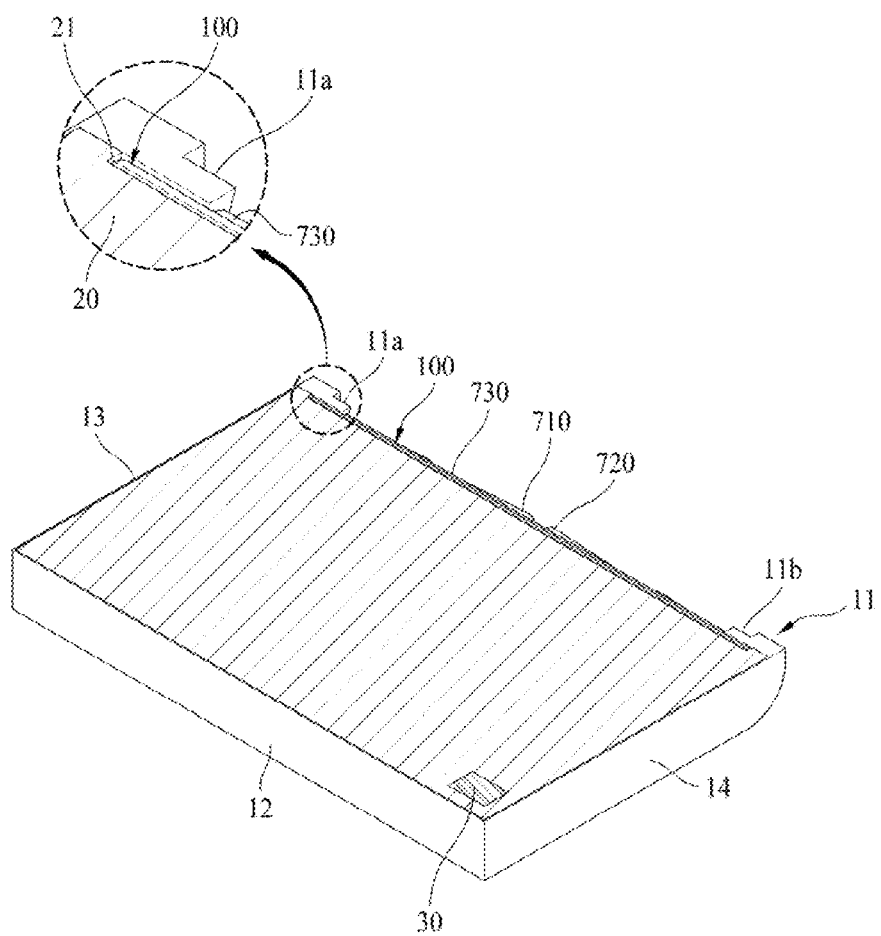
FIG. 3 illustrates an outer portion of a sliding display apparatus according to an aspect of the present disclosure.
Figure 4:
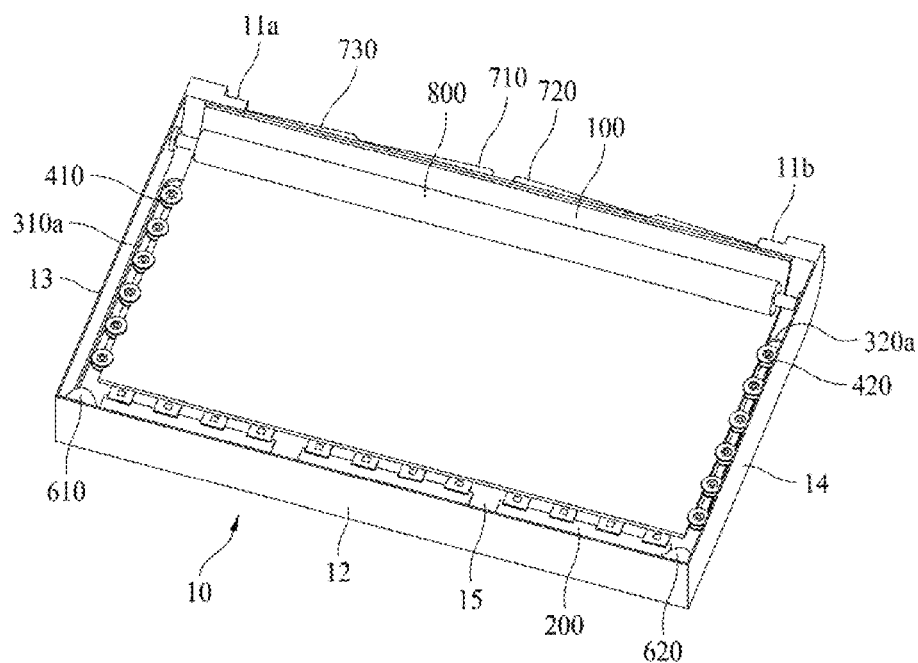
FIG. 4 illustrates an inner portion of a sliding display apparatus from which a cover illustrated in FIG. 3 is removed.
Figure 5:
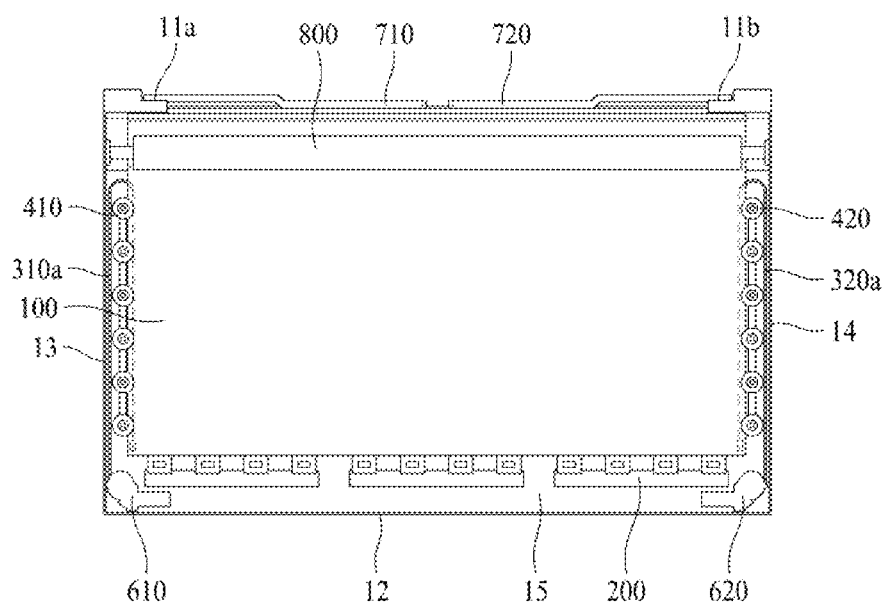
FIG. 5 is a plan view of a sliding display apparatus illustrated in FIG. 4.

FIG. 3 illustrates an outer portion of a sliding display apparatus according to an aspect of the present disclosure. FIG. 4 is a perspective view illustrating an inner portion of the sliding display apparatus from which a cover illustrated in FIG. 3 is removed. FIG. 5 is a plan view of the sliding display apparatus illustrated in FIG. 4.

The sliding display apparatus according to an aspect of the present disclosure, as illustrated in FIGS. 1 to 5, may include a display panel 100, a case 10, a cover 20, a plurality of wire driving parts 610 and 620, and a sliding controlling part 30.

The display panel 100 may be accommodated into the case 10. The cover 20 may cover an opened upper surface of the case 10, and a hole 21 through which the display panel 100 comes up may be provided at one side thereof. The wire driving parts 610 and 620 may be connected to one or more wires (for example, first and second wires) 310a and 320a connected to a lower surface of the display panel 100. The sliding controlling part 30 may control the wire driving parts 610 and 620.

First, the display panel 100 may include a panel 110 which displays an image and a back plate 120 attached on a lower surface of the panel 110. A first fixing part 310b connected to the first wire 310a may be provided at one side of the lower surface of the back plate 120. For example, the first fixing part 310b connected to the first wire 310a may be provided at an end of one side of the lower surface of the back plate 120. A second fixing part 320b connected to the second wire 320a may be provided at the other side of the lower surface of the back plate 120. For example, the second fixing part 320b connected to the second wire 320a may be provided at an end of the other side of the lower surface of the back plate 120.

An upper portion or a second portion of the display panel 100 may be exposed through the hole 21. Also, when the wire driving parts 610 and 620 pulls a wire, the display panel 100 may come up in an upward direction of the case 10 through the hole 21.

Subsequently, the display panel 100 may be accommodated into the case 10. The case 10 may include a first sidewall 11, a second sidewall 12, a third sidewall 13, a fourth sidewall 14, and a lower wall 15. The display panel 10 may include a first side surface, a second side surface, a third side surface, and a fourth side surface. In the following description, the first side surface may be adjacent to the first sidewall 11, the second side surface may be adjacent to the second sidewall 12, the third side surface may be adjacent to the third sidewall 13, and the fourth side surface may be adjacent to the fourth sidewall 14. In this case, an upper portion of the display panel 100 may be exposed at the outside through the hole 21 formed at a portion, which is adjacent to the first sidewall 11, of the cover 20.

The first sidewall 11 may be provided at a first side of the lower wall 15, the second sidewall 12 may be provided at a second side of the lower wall 15, the third sidewall 13 may be provided at a third side of the lower wall 15, and the fourth sidewall 14 may be provided at a fourth side of the lower wall 15.

The first sidewall 11 may be adjacent to the hole 21 of the cover 20. For example, the hole 21 may be provided at the cover 20 along the first sidewall 11.

The second sidewall 12 may be provided to face the first sidewall 11.

The third sidewall 13 may be provided between the first sidewall 11 and the second sidewall 12.

The fourth sidewall 14 may be provided between the first sidewall 11 and the second sidewall 12 and may be provided to face the third sidewall 13.

The cover 20 may be provided on the first sidewall 11, the second sidewall 12, the third sidewall 13, and the fourth sidewall 14.

For example, a lower surface formed by the first to fourth sidewalls 11 to 14 may be covered by the lower wall 15, and an upper surface formed by the first to fourth sidewalls 11 to 14 may be covered by the cover 20.

The display panel 100 may be provided on an upper surface of the lower wall 15.

Subsequently, the cover 20 may cover the upper surface (for example, an opened upper surface of the case 10 formed by the first to fourth sidewalls 11 to 14).

The hole 21 through which the display panel 100 comes up may be provided at one side (for example, a first side) of the cover 20. The hole 21 may be provided at the cover 20 along the first sidewall 11 of the case 10.

For example, a size of the hole 21 may be adjusted to a size which enables the upper portion or the second portion of the display panel 100 to be come up.

For example, a length of the hole 21 formed in a direction from the third sidewall 13 of the case 10 to the fourth sidewall 14 of the case 10 may be adjusted to be greater than that of the upper portion or the second portion of the display panel 100.

A width of the hole 21 formed in a direction from the first sidewall 11 of the case 10 to the second sidewall 12 of the case 10 may be adjusted to be greater than that of the upper portion of the display panel 100, for example, a thickness of the display panel 100.

Subsequently, the wire driving parts 610 and 620 may be connected to the one or more wires 310a and 320a connected to the lower surface of the display panel 100.

For example, as described above, the one or more wires 310a and 320a may be disposed at a lower surface of the back plate 120 configuring the display panel 100. For example, in FIG. 1, the display panel 100 where the first wire 310a and the second wire 320a are provided is illustrated for an aspect of the present disclosure. In this case, the first fixing part 310b connected to the first wire 310a may be provided at one side of the lower surface of the back plate 120. For example, the first fixing part 310b connected to the first wire 310a may be provided at the end of the one side or the one side of the lower surface of the back plate 120. The second fixing part 320b connected to the second wire 320a may be provided at the other side of the lower surface of the back plate 120. For example, the second fixing part 320b connected to the second wire 320a may be provided at the end of the other side or the other side of the lower surface of the back plate 120.

In this case, the wire driving part may include a first rotation part 610 which is disposed at one side of an inner portion of the case and is connected to the first wire 310a and a second rotation part 620 which is disposed at the other side of the inner portion of the case and is connected to the second wire 320a.

For example, the first rotation part 610 may be disposed at one side of the inner portion of the case. The first rotation part 610 may be connected to the first wire 310a connected to one side of the lower surface of the display panel 100. For example, the first rotation part 610 may be connected to the first wire 310a connected to an end of the one side of the lower surface of the display panel 100.

The second rotation part 620 may be disposed at the other side of the inner portion of the case. The second rotation part 620 may be connected to the second wire 320a connected to the other side of the lower surface of the display panel 100. For example, the second rotation part 620 may be connected to the second wire 320a connected to the end of the other side of the lower surface of the display panel 100.

The one side of the inner portion of the case, for example, may be a portion, connected to the second sidewall 12 and the third sidewall 13, among an upper surface of the lower wall 15. The other side of the inner portion of the case, for example, may be a portion, connected to the second sidewall 12 and the fourth sidewall 14, among the upper surface of the lower wall 15.

For example, in FIGS. 3 to 5, the one side of the inner portion of the case may be a left lower portion of the lower wall 15, and the other side of the inner portion of the case may be a right lower portion of the lower wall 15.

Each of the first rotation part 610 and the second rotation part 620 may be a motor.

Finally, the sliding controlling part 30 may control the wire driving part 610 and 620.

For example, the first rotation part 610 and the second rotation part 620 may be driven by the sliding controlling part 30.

To this end, the sliding controlling part 30 may be connected to the first rotation part 610 and the second rotation part 620.

The sliding controlling part 30 may be a wireless controller which is driven by a remote controller or a button, to turn on or off the first rotation part 610 and the second rotation part 620.

For example, a user may directly touch a button configuring the sliding controlling part 30 to drive the wire driving parts 610 and 620. Also, the user may transmit a wireless control signal to the sliding controlling part 30 by using a remote controller, and the wire driving parts 610 and 620 may be driven by the sliding controlling part 30 which has received the wireless control signal. The first rotation part 610 and the second rotation part 620 included in the wire driving parts 610 and 620 may be simultaneously driven.

The sliding controlling part 30 may perform communication with the external system.

For example, when the sliding controlling part 30 is turned on based on the button or the wireless control signal, the external system may also be turned on, and thus, the panel driving part 200 may operate.

Figure 6:
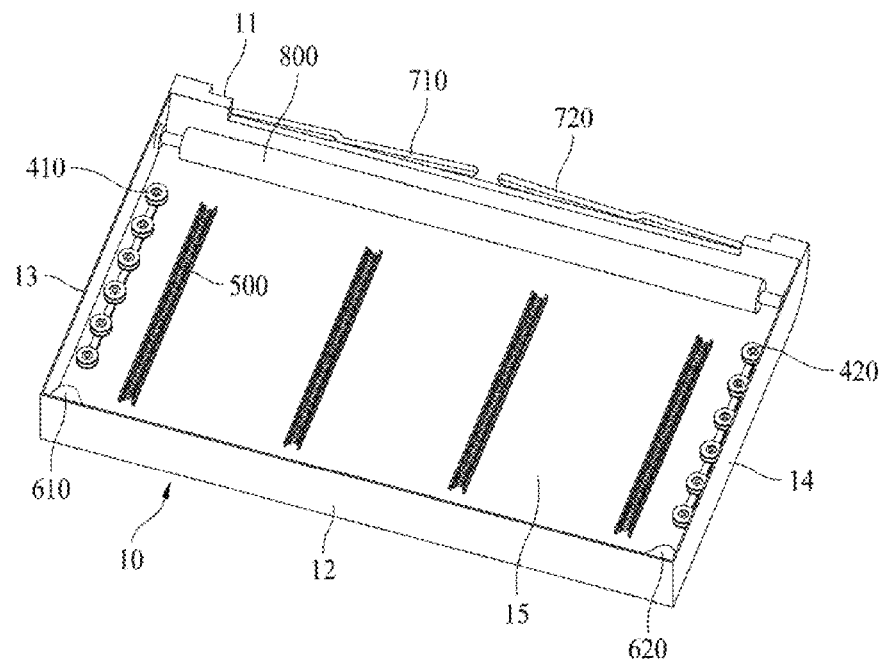
FIG. 6 illustrates an inner portion of a case applied to a sliding display apparatus according to an aspect of the present disclosure.

FIG. 6 illustrates an inner portion of a case applied to a sliding display apparatus according to an aspect of the present disclosure. For example, FIG. 6 illustrates an upper surface of a lower wall of a case, and for example, illustrates an upper surface of a lower wall from which a display panel 100 is removed.

As described above with reference to FIGS. 1 to 5, the sliding display apparatus according to an aspect of the present disclosure may include a display panel 100, a case 10, a cover 20, a wire driving part, and a sliding controlling part 30.

The sliding display apparatus according to an aspect of the present disclosure may further include a first guide roller 410 and a second guide roller 420.

The first guide roller 410, for example, may be disposed at an inner space of the case 10, and for example, may be disposed at an upper surface of a lower wall 15 of the case 10.

The second guide roller 420, for example, may be disposed at the inner space of the case 10, and for example, may be disposed at the upper surface of the lower wall 15 of the case 10 and may be disposed to face the first guide roller 410.

For example, in FIG. 6, the sliding display apparatus where six first guide rollers and six second guide rollers 420 are provided is illustrated for an aspect of the present disclosure. However, aspects of the present disclosure are not limited thereto.

The first guide roller 410 may be disposed at one side of an inner portion of the case 10 and may guide a third side surface and a first wire 310a of the display panel 100. Here, the one side of the inner portion of the case 10 may be a portion adjacent to a third sidewall 13 of the case 10. A third side surface of the display panel 100 may be a surface adjacent to the third sidewall 13.

For example, at least one first guide roller 410 may be provided along the third sidewall 13 at a portion adjacent to the third sidewall 13.

The at least one first guide roller 410, as illustrated in FIGS. 3 to 5, may guide the third side surface of the display panel 100, for example, a left surface of the display panel 100.

Moreover, the at least one first guide roller 410 may guide the first wire 310a connected to a lower surface of the display panel 100. For example, the first wire 310a may be supported by the at least one first guide roller 410 along with the third side surface of the display panel 100, and for example, may be bent to a space between the first guide roller 410 and the third sidewall 13 along a first guide roller 410, which is adjacent to the first sidewall 11, among the at least one first guide roller 410.

The first wire 310a bent to the space between the first guide roller 410 adjacent to the first sidewall 11 and the third sidewall 13 may be disposed at the one side of the inner portion of the case 10 and may be connected to a first rotation part 610.

The first wire 310a may be wound around the first rotation part 610 or may be unwound from the first rotation part 610.

The second guide roller 420 may be disposed at the other side of the inner portion of the case 10 and may guide a fourth side surface and a second wire 320a of the display panel 100. Here, the other side of the inner portion of the case 10 may be a portion adjacent to a fourth sidewall 14 of the case 10. A fourth side surface of the display panel 100 may be a surface adjacent to the fourth sidewall 14.

For example, at least one second guide roller 420 may be provided along the fourth sidewall 14 at a portion adjacent to the fourth sidewall 14.

The at least one second guide roller 420, as illustrated in FIGS. 3 to 5, may guide the fourth side surface of the display panel 100, for example, a right surface of the display panel 100.

Moreover, the at least one second guide roller 420 may guide the second wire 320a connected to the lower surface of the display panel 100. For example, the second wire 320a may be supported by the at least one second guide roller 420 along with the fourth side surface of the display panel 100. For example, the second wire 320a may be bent to a space between the second guide roller 420 and the fourth sidewall 14 along a second guide roller 420, which is adjacent to the first sidewall 11, among the at least one second guide roller 420.

The second wire 320a bent to the space between the second guide roller 420 adjacent to the first sidewall 11 and the fourth sidewall 14 may be disposed at the other side of the inner portion of the case 10 and may be connected to a second rotation part 620.

The second wire 320a may be wound around the second rotation part 620 or may be unwound from the second rotation part 620.

The sliding display apparatus according to an aspect of the present disclosure may further include a roller 800.

The roller 800 may be provided adjacent to the first sidewall 11 of the case 10. The roller 800 may be disposed to be rotatable with respect to the third sidewall 13 and the fourth sidewall 14 of the case 10 connected to both sides of the first sidewall 11.

A hole 21 may be provided at the cover 20 along the roller 800, in a region adjacent to the first sidewall 11 of the case 10.

The display panel 100 may be come up from the hole 21 through a space between the first sidewall 11 of the case 10 and the roller 800.

The sliding display apparatus according to an aspect of the present disclosure may further include at least one transport roller 500. In FIG. 6, the sliding display apparatus including four transport rollers 500 is illustrated as an aspect of the present disclosure.

The transport roller 500 may be provided at the lower wall 15 of the case 10 and may support the display panel 100.

The transport roller 500 may extend in a direction from the first sidewall 11 to the second sidewall 12. For example, the transport roller 500 may be disposed in parallel with the third sidewall 13 or the fourth sidewall 14.

The display panel 100 may be provided at an upper portion of the at least one transport roller 500. For example, the display panel 100 may be transported in a direction of the third sidewall 13 or the fourth sidewall 14 in a state which is supported by the transport roller 500.

In this case, both side surfaces of the display panel 100 may be guided by the first guide roller 410 and the second guide roller 420.

For example, the display panel 100 may be disposed between the first guide roller 410 and the second guide roller 420 and may be transported in a direction toward the first sidewall 11 along the transport roller 500. An upper portion of the display panel 100 transported in the direction toward the first sidewall 11 may be come up through the hole 21.

Moreover, the display panel 100 may be disposed between the first guide roller 410 and the second guide roller 420 and may be transported in a direction toward the second sidewall 12 along the transport roller 500. Also, the display panel 100 may be provided at an upper end of the transport roller 500.

Figure 7:
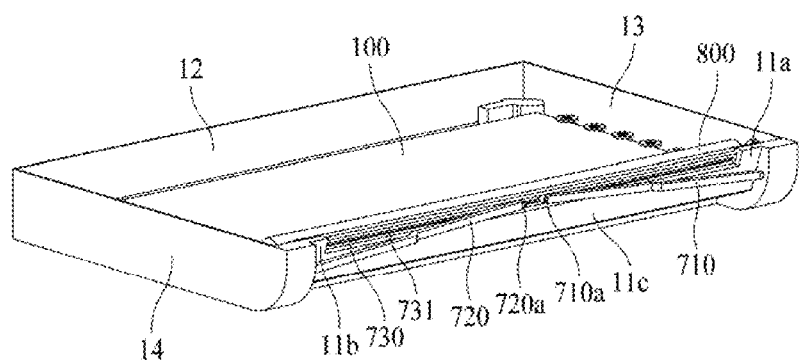
FIGS. 7 and 8 illustrate a first sidewall of a sliding display apparatus according to an aspect of the present disclosure.
Figure 8:
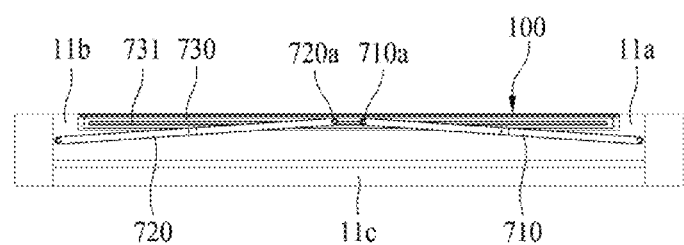
Figure 9:
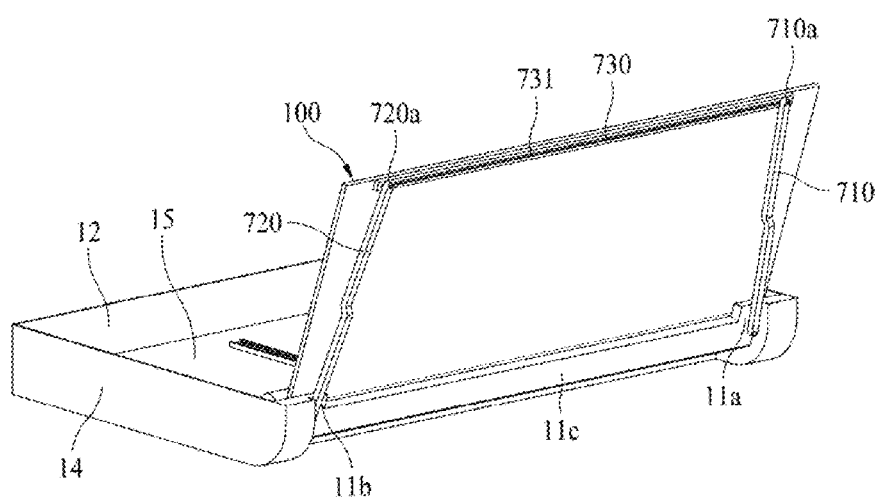
FIGS. 9 and 10 illustrate a first sidewall of a sliding display apparatus according to another aspect of the present disclosure.
Figure 10:
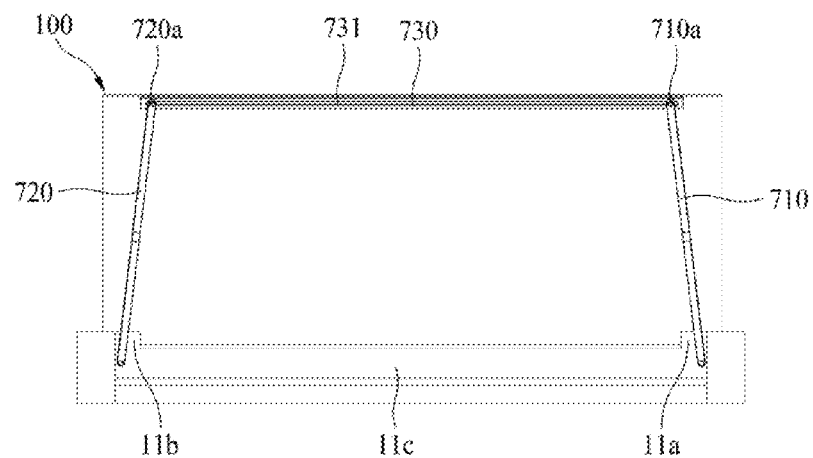

FIGS. 7 and 8 illustrate a first sidewall of a sliding display apparatus according to an aspect of the present disclosure, and for example, are exemplary diagrams illustrating a sliding display apparatus where a display panel 100 is accommodated into an inner space thereof. FIGS. 9 and 10 illustrate a first sidewall of a sliding display apparatus according to another aspect of the present disclosure, and for example, are exemplary diagrams illustrating a sliding display apparatus where a display panel 100 is exposed in a direction toward an upper end of a cover 20 through a hole 21.

A case 10 may include a first sidewall 11, a second sidewall 12, a third sidewall 13, a fourth sidewall 14, and a lower wall 15. The display panel 100 may include a first side surface, a second side surface, a third side surface, and a fourth side surface. The first side surface may be adjacent to the first sidewall 11, the second side surface may be adjacent to the second sidewall 12, the third side surface may be adjacent to the third sidewall 13, and the fourth side surface may be adjacent to the fourth sidewall 14. An upper portion of the display panel 100 (for example, a portion corresponding to the first side surface) may be exposed at the outside through a hole 21 formed at a portion, which is adjacent to the first sidewall 11, of the cover 20.

A link guide 730 may be disposed at a rear surface of an upper portion, exposed through the hole 21, of the display panel 100 in parallel with the hole 21. For example, the link guide 730 may be disposed on a lower surface of an upper portion of the display panel 100, for example, a lower surface of an upper portion of a back plate 120.

The link guide 730 may be disposed at a lower surface of the upper portion of the back plate 120 along the first side surface of the display panel 100. In this case, a length of the link guide 730 may be less than or equal to that of the first side surface.

One side or one end of a first link 710 may be disposed to be rotatable in a first region 11a of the first sidewall 11, which is adjacent to the hole 21, among the case 10. One side or one end of a second link 720 may be disposed to be rotatable in a second region 11b of the first sidewall 11. Also, the other side or the other end of the first link 710 may be connected to the link guide 730, and the other side or the other end of the second link 720 may be connected to the link guide 730.

For example, the one side or the one end of the first link 710 may be disposed to be rotatable at the first region 11a of the first sidewall 11, and the other side or the other end of the first link 710 may be connected to the link guide 730. Also, the one side or the one end of the second link 720 may be disposed to be rotatable at the second region 11b of the first sidewall 11, and the other side or the other end of the second link 720 may be connected to the link guide 730.

For example, the other side or the other end of the first link 710 and the other side or the other end of the second link 720 may be disposed to face each other in the link guide 730. The other side or the other end of the first link 710 and the other side or the other end of the second link 720 may move along the link guide 730.

To this end, a first link bar 710a disposed to be rotatable at the other side or the other end of the first link 710 may be inserted or accommodated into a groove 731 of the link guide 730. A second link bar 720a disposed to be rotatable at the other side or the other end of the second link 720 may be inserted or accommodated into the groove 731 of the link guide 730.

For example, as the first link bar 710a rotates in the groove 731 of the link guide 730, the first link 710 may move along the groove 731 of the link guide 730. As the second link bar 720a rotates in the groove 731 of the link guide 730, the second link 720 may move along the groove 731 of the link guide 730.

The first sidewall 11 may include a first region 11a, a second region 11b, and a third region 11c between the first region 11a and the second region 11b. For example, the link guide 730 may be supported by the third region 11c.

For example, as illustrated in FIGS. 7 and 8, when only an upper portion of the display panel 100 is exposed through the hole 21, the link guide 730 may be supported by the third region 11c. Therefore, the display panel 100 may not be inserted or accommodated into the hole 21. In this case, the first link 710 and the second link 720 may be disposed to face each other at a center portion of the link guide 730.

Moreover, when the display panel 100 comes up in an upward direction of a cover 20 through the hole 21, the first link 710 and the second link 720 may be progressively farther away from the center portion of the link guide 730 and may be disposed at a position illustrated in FIGS. 9 and 10.

Therefore, the display panel 100 come up through the hole 21 may be maintained in a tight state by the first link 710, the second link 720, and the link guide 730.

Figure 11:
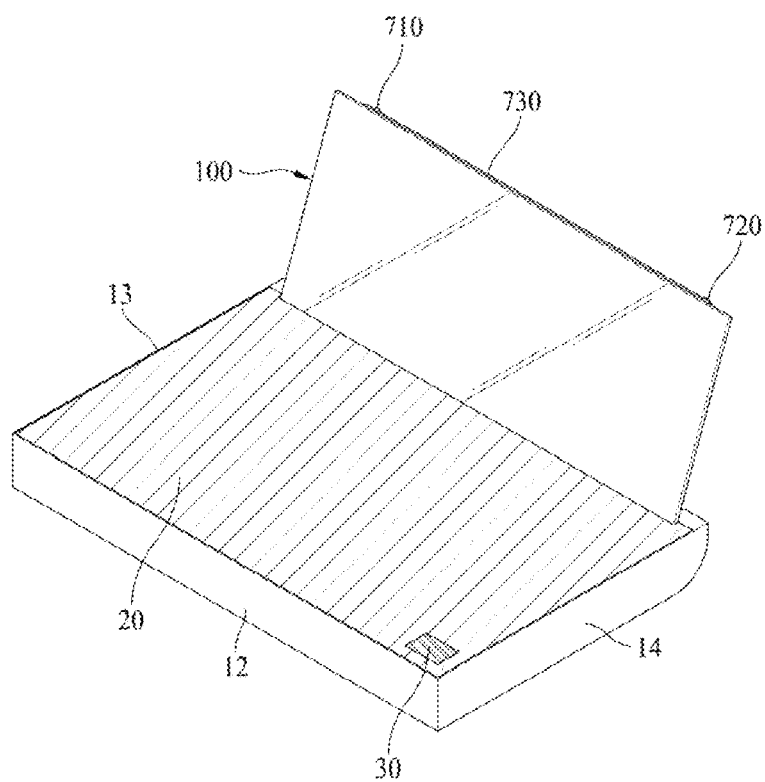
FIG. 11 illustrates a front of a sliding display apparatus according to an aspect of the present disclosure.

FIG. 11 illustrate a front of a sliding display apparatus according to an aspect of the present disclosure, and for example, are exemplary diagrams illustrating a sliding display apparatus where a display panel 100 is completely exposed in an upward direction of a cover 20 through a hole 21. FIG. 3 illustrates a sliding display apparatus where a display panel 100 is accommodated into an inner space of a case 10, and FIG. 10 illustrates a sliding display apparatus where most portions of a display panel 100 are completely come up through a discharging hole 21.

Hereinafter, a process of come up a display panel to the outside of a sliding display apparatus through a hole 21 and a process of inserting or accommodating the display panel into the sliding display apparatus through the hole 21 will be described with reference to FIGS. 1 to 11. In the following description, descriptions which are the same as or similar to descriptions given above with reference to FIGS. 1 to 10 are omitted or will be briefly given.

As illustrated in FIGS. 7 and 8, when most portions of the display panel 100 are inserted or accommodated into an inner space formed by the case 10 and the cover 20, only the upper portion of the display panel 100 may be exposed through the hole 21.

In this case, the link guide 730 may be supported by the third region 11c. Therefore, the display panel 100 may not be inserted or accommodated into the hole 21. In this case, the first link 710 and the second link 720 may be disposed to face each other at the center portion of the link guide 730. Accordingly, the first link 710 and the second link 720 may no longer move along the link guide 730, and thus, the display panel 100 may no longer be inserted or accommodated into the hole 21.

For example, the display panel 100 may not be inserted or accommodated into the case by the link guide 730, and moreover, may not be inserted or accommodated into the case by the first link 710, the second link 720, and the link guide 730.

Subsequently, when a user turns on a button or a switch included in the sliding controlling part 30 or transmits, to the sliding controlling part 30, a wireless control signal for turning on the sliding controlling part 30 by using a remote controller, the sliding controlling part 30 may be turned on.

When the sliding controlling part 30 is turned on, the sliding controlling part 30 may drive the first rotation part 610 and the second rotation part 620.

Subsequently, when the first rotation part 610 is driven by the sliding controlling part 30, a motor configuring the first rotation part 610 may rotate, and thus, the first wire 310a may be drawn to the first rotation part 610 and may be wound around the first rotation part 610.

When the second rotation part 620 is driven by the sliding controlling part 30, a motor configuring the second rotation part 620 may rotate, and thus, the second wire 320a may be drawn to the second rotation part 620 and may be wound around the second rotation part 620.

Subsequently, the first wire 310a may be connected to the first fixing part 310b provided in a second lateral direction of the display panel 100, for example, adjacent to the second sidewall 12 and may extend in a direction toward the first sidewall 11 along the first guide roller 410. The first wire 310a may be bent by the adjacent first guide roller 410 in a direction toward the first sidewall 11 and may be again connected to the first rotation part 610 provided in a direction toward the second sidewall 12.

The second wire 320a may be connected to the second fixing part 320b provided at a position in the second lateral direction of the display panel 100, for example, the adjacent to second sidewall 12 and may extend in the direction toward the first sidewall 11 along the second guide roller 420. The second wire 320a may be bent by the adjacent second guide roller 420 in a direction toward the first sidewall 11 and may be again connected to the second rotation part 620 provided in a direction toward the second sidewall 12.

Therefore, when the first wire 310a is wound around the first rotation part 610 and the second wire 320a is wound around the second rotation part 620, the second side surface of the display panel 100 may move in the direction toward the first sidewall 11 along the first wire 310a and the second wire 320a. For example, when the first wire 310a is wound around the first rotation part 610 and the second wire 320a is wound around the second rotation part 620, the display panel 100 may move in a direction from the second sidewall 12 to the first sidewall 11.

Subsequently, the display panel 100 which has moved in the direction toward the first sidewall 11 may come up in the upward direction of the cover 20 through the hole 21.

For example, the display panel 100 which has moved in the direction toward the first sidewall 11 may come up from the hole 21 through a space between the first sidewall 11 of the case 10 and the roller 800.

Here, the upward direction of the cover 20 may be a direction vertical to a plane of the cover 20. However, the display panel 100 come up in the upward direction of the cover 20 may not denote that the display panel 100 comes up the direction vertical to the plane of the cover 20. For example, the display panel 100 may come up in the direction vertical to the plane of the cover 20, and for example, may come up at various angles with respect to the cover 20. An angle, by which the display panel 100 is inclined with respect to the plane of the cover 20, may be variously adjusted based on lengths or angles of the first link 710 and the second link 720.

Subsequently, when the display panel 100 comes up in the upward direction of the cover 20, the other end of the first link 710 and the other side or the other end of the second link 720 adjacent to each other at a center portion of the link guide 730 may be spaced apart from each other.

For example, when the display panel 100 comes up in the upward direction of the cover 20, the upper portion of the display panel 100 may be progressively farther away from the cover 20. Also, the link guide 730 disposed at the display panel 100 may be progressively farther away from the cover 20.

Therefore, the first link 710 and the second link 720 may move in a direction vertical to an upper surface of the cover 20. Accordingly, the other side or the other end of the first link 710 and the other side or the other end of the second link 720 adjacent to each other at the center portion of the link guide 730 may be progressively farther away from each other.

Subsequently, when the display panel 100 maximally comes up in the upward direction of the cover 20, as illustrated in FIGS. 9 to 10, the other side or the other end of the first link 710 may contact one end of the link guide 730, and the other side or the other end of the second link 720 may contact the other end of the link guide 730.

For example, the first link 710 and the second link 720 may be spaced apart from the center portion of the link guide 730 by a maximum distance. Accordingly, the first link 710 and the second link 720 may no longer move along the link guide 730.

That the first link 710 and the second link 720 do not move along the link guide 730 any longer may denote that the display panel 100 maximally comes up through the hole 21.

In this state, the display panel 100 may be driven by the panel driving part 200 and may display an image.

Therefore, in a state illustrated in FIGS. 9 to 11, a user may watch an image displayed by the display panel 100.

Finally, when a user turns off a button or a switch included in the sliding controlling part 30 or transmits, to the sliding controlling part 30, a wireless control signal for turning off the sliding controlling part 30 by using the remote controller, the sliding controlling part 30 may be turned off, and thus, operations described above may be performed in reverse order.

For example, the first link 710 and the second link 720 may move toward the center portion of the link guide 730 to get closer to each other, and thus, a height of the upper portion of the display panel 100 may be progressively reduced.

In this case, a motor configuring the first rotation part 610 and the second rotation part 620 may rotate in a second direction opposite to a first direction, and thus, the first wire 310a and the second wire 320a may be unwound from the first rotation part 610 and the second rotation part 620.

For example, when the first link 710, the second link 720, and the link guide 730 are lowered by gravity in a direction toward the first sidewall 11, the first wire 310a and the second wire 320a may be unwound from the first rotation part 610 and the second rotation part 620. Accordingly, the second side surface of the display panel 100 may move in a direction from the first sidewall 11 to the second sidewall 12.

When the first link 710 and the second link 720 face each other at the center portion of the third link 730 and link guide 730 is supported by the first sidewall 11, the display panel 100 may not be lowered any longer.

In this case, most regions, other than the upper portion, of the display panel 100 may be placed at the lower wall 15 of the case 10.

According to an aspect of the present disclosure, the display panel 100 may be disposed in parallel with the lower wall 15 of the case 10. Depending on the case, the display panel 100 may protrude in the upward direction of the cover 20 covering the case 10.

Therefore, even when the case 10 is disposed at a plane of a desk or the like, the case 10 may not largely protrude from the plane of the desk. Also, even when the case 10 is disposed at a lower end of a desk or the like, the case 10 may not largely protrude in a direction toward the lower end of the desk. For example, a height of the sliding display apparatus according to an aspect of the present disclosure may be formed to be flat, and thus, even when the sliding display apparatus according to an aspect of the present disclosure is used with being buried into a desk or the like, an external appearance of the desk may not largely be damaged. For example, the sliding display apparatus according to an aspect of the present disclosure may be buried in a ceiling or furniture such as a desk or a bed, and thus, may have an advantage in design. Accordingly, the sliding display apparatus according to an aspect of the present disclosure may be suitably disposed or embedded and used in a structure such as a desk, a bed, or furniture. For example, the sliding display apparatus may be built in or equipped with bedside or headboard.

A sliding display apparatus according to an aspect of the present disclosure will be described below.

A sliding display apparatus according to an aspect of the present disclosure comprises a display panel including first to fourth side surfaces, a case configured to accommodate the display panel, a cover configured to cover an opened upper surface of the case and including a hole provided at one side thereof, a wire driving part connected to at least one wire connected to a lower surface of the display panel, and a sliding controlling part configured to control the wire driving part, and an upper portion of the display panel may be exposed through the hole provided at the cover.

According to some aspects of the present disclosure, when the wire driving part pulls the wire, the display panel may be configured to come up in an upward direction of the case through the hole.

According to some aspects of the present disclosure, the display panel may be disposed at a lower surface of the case and in parallel with the lower surface.

According to some aspects of the present disclosure, the display panel may include a panel configured to display an image and a back plate disposed at a lower surface of the panel.

According to some aspects of the present disclosure, a first fixing part connected to a first wire may be disposed at one side of a lower surface of the back plate, and a second fixing part connected to a second wire may be disposed at another side of the lower surface of the back plate.

According to some aspects of the present disclosure, the wire driving part may include a first rotation part disposed at one side of an inner portion of the case and connected to the first wire and a second rotation part disposed at another side of the inner portion of the case and connected to the second wire.

According to some aspects of the present disclosure, each of the first rotation part and the second rotation part may be a motor.

According to some aspects of the present disclosure, the first wire may be wound around the first rotation part or may be unwound from the first rotation part, and the second wire may be wound around the second rotation part or may be unwound from the second rotation part.

According to some aspects of the present disclosure, the sliding display apparatus may further include at least one transport roller disposed at a lower wall of the case and configured to support the display panel.

According to some aspects of the present disclosure, the wire driving part may include a first rotation part disposed at one side of an inner portion of the case and connected to a first wire connected to one side of a lower surface of the display panel and a second rotation part disposed at another side of the inner portion of the case and connected to a second wire connected to another side of the lower surface of the display panel.

According to some aspects of the present disclosure, each of the first rotation part and the second rotation part may be a motor.

According to some aspects of the present disclosure, the first wire may be wound around the first rotation part or may be unwound from the first rotation part, and the second wire may be wound around the second rotation part or may be unwound from the second rotation part.

According to some aspects of the present disclosure, the sliding display apparatus may further include at least one first guide roller disposed at one side of an inner portion of the case to guide the first wire and a third side surface of the display panel and at least one second guide roller disposed at another side of the inner portion of the case to guide the second wire and a fourth side surface of the display panel.

According to some aspects of the present disclosure, the sliding display apparatus may further include a roller disposed adjacent to a first sidewall of the case and implemented to be rotatable on a second sidewall and a third sidewall of the case connected to both sides of the first sidewall, and the hole may be disposed adjacent to the first sidewall and disposed along the roller.

According to some aspects of the present disclosure, the display panel may be configured to come up from the hole through a space between the first sidewall of the case and the roller.

According to some aspects of the present disclosure, the sliding display apparatus may further include a link guide at a rear surface of an upper portion exposed through the hole of the display panel and in parallel with the hole, a first link disposed at a first region of a first sidewall adjacent to the hole among the case, and a second link disposed at a second region of the first sidewall. One side of the first link may be configured to be rotatable at the first region of the first sidewall, one side of the second link may be configured to be rotatable at the second region of the first sidewall, another side of the first link may be connected to the link guide, and another side of the second link may be connected to the link guide.

According to some aspects of the present disclosure, the another side of the first link and the another side of the second link may be disposed to face each other at the link guide, and the another side of the first link and the another side of the second link may move along the link guide.

According to some aspects of the present disclosure, the sliding display apparatus may further include a first link bar configured to be rotatable at the another side of the first link, a second link bar configured to be rotatable at the another side of the second link, and a groove at the link guide. The first link bar may be accommodated into the groove of the link guide, and the second link bar may be accommodated into the groove of the link guide.

According to some aspects of the present disclosure, the first sidewall may include a first region, a second region, and a third region between the first region and the second region, and the link guide may be supported by the third region.

According to aspects of the present disclosure, there is a provided a device having a flat structure into which a sliding display apparatus is embedded. The sliding display apparatus comprises a display panel including first to fourth side surfaces, a case configured to accommodate the display panel, a cover configured to cover an opened upper surface of the case and including a hole provided at one side thereof, a wire driving part connected to at least one wire connected to a lower surface of the display panel, and a sliding controlling part configured to control the wire driving part, and an upper portion of the display panel may be exposed through the hole provided at the cover.

According to aspects of the present disclosure, a display panel kept in a state which is unfolded in a case may be exposed in an upward direction of the case based on a sliding method.

Therefore, it may not be required to increase a height of the case to maintain the display panel.

Accordingly, the sliding display apparatus according to the aspects of the present disclosure may be embedded into a flat structure of furniture such as desks or beds. For example, a sliding display apparatus may be suitably built in or equipped with a structure such as a desk, a bed, or furniture.

It will be apparent to those skilled in the art that various modifications and variations may be made in the present disclosure without departing from the technical idea or scope of the disclosures. Thus, it may be intended that aspects of the present disclosure cover the modifications and variations of the disclosure provided they come within the scope of the appended claims and their equivalents.

What is claimed is:

1. A sliding display apparatus, comprising:
a display panel including a panel configured to display an image and a back plate disposed at a lower surface of the panel;
a case configured to accommodate the display panel;
a cover configured to cover an opened upper surface of the case and including a hole provided at one side thereof;
a wire driving part connected to a first wire and a second wire connected to a lower surface of the display panel; and
a sliding controlling part configured to control the wire driving part,
wherein an upper portion of the display panel is exposed through the hole provided at the cover, and
wherein the first wire and the second wire are wound around the wire driving part.

2. The sliding display apparatus of claim 1, wherein, when the wire driving part pulls the first wire and the second wire, the display panel is configured to come up in an upward direction of the case through the hole.

3. The sliding display apparatus of claim 1, wherein the display panel is disposed at a lower surface of the case and in parallel with the lower surface.

4. The sliding display apparatus of claim 1, further comprising:
a first fixing part connected to the first wire, the first fixing part disposed at one side of a lower surface of the back plate; and
a second fixing part connected to the second wire, wherein the second fixing part is disposed at another side of the lower surface of the back plate.

5. The sliding display apparatus of claim 1, wherein the wire driving part comprises:
a first rotation part disposed at one side of an inner portion of the case and connected to the first wire; and
a second rotation part disposed at another side of the inner portion of the case and connected to the second wire, and
wherein each of the first rotation part and the second rotation part is a motor.

6. The sliding display apparatus of claim 5, wherein the first wire is wound around the first rotation part or is unwound from the first rotation part, and the second wire is wound around the second rotation part or is unwound from the second rotation part.

7. The sliding display apparatus of claim 1, further comprising at least one transport roller disposed at a lower wall of the case and configured to support the display panel.

8. The sliding display apparatus of claim 1, wherein the first wire is connected to one side of a lower surface of the display panel, and
wherein the second wire is connected to another side of the lower surface of the display panel.

9. The sliding display apparatus of claim 1, further comprising:
at least one first guide roller disposed at one side of an inner portion of the case to guide the first wire; and
at least one second guide roller disposed at another side of the inner portion of the case to guide the second wire.

10. The sliding display apparatus of claim 9, wherein the display panel includes a first side surface, a second side surface, a third side surface, and a fourth side surface,
wherein the first side surface is disposed in the upper portion of the display panel,
wherein the second side surface faces the first side surface,
wherein the third side surface is disposed between the first side surface and the second side surface, and
wherein the fourth side surface faces the third side surface.

11. The sliding display apparatus of claim 10, wherein the at least one first guide roller guides the first wire and the third side surface; and
wherein the at least one second guide roller guides the second wire and the fourth side surface.

12. The sliding display apparatus of claim 1, further comprising a roller disposed adjacent to a first sidewall of the case and implemented to be rotatable on a second sidewall and a third sidewall of the case connected to both sides of the first sidewall,
wherein the hole is disposed adjacent to the first sidewall and disposed along the roller.

13. The sliding display apparatus of claim 12, wherein the display panel is configured to come up from the hole through a space between the first sidewall of the case and the roller.

14. The sliding display apparatus of claim 1, further comprising:
a link guide disposed at a rear surface of an upper portion exposed through the hole of the display panel and in parallel with the hole;
a first link disposed at a first region of a first sidewall adjacent to the hole among the case; and
a second link disposed at a second region of the first sidewall.

15. The sliding display apparatus of claim 14, wherein one side of the first link is configured to be rotatable at the first region of the first sidewall, wherein one side of the second link is configured to be rotatable at the second region of the first sidewall, wherein another side of the first link is connected to the link guide, and wherein another side of the second link is connected to the link guide.

16. The sliding display apparatus of claim 15, wherein another side of the first link and another side of the second link are disposed to face each other at the link guide, and wherein another side of the first link and another side of the second link move along the link guide.

17. The sliding display apparatus of claim 16, further comprising:

a first link bar configured to be rotatable at another side of the first link;

a second link bar configured to be rotatable at another side of the second link; and a groove at the link guide, wherein the first link bar is accommodated into the groove of the link guide, and the second link bar is accommodated into the groove of the link guide.

18. The sliding display apparatus of claim 14, wherein the first sidewall comprises a first region, a second region, and a third region between the first region and the second region, and wherein the link guide is supported by the third region.

19. A device having a flat structure into which the sliding display apparatus of claim 1 is embedded.

\* \* \* \* \*